United States Patent [19]

Sokolovsky et al.

[11] Patent Number: 5,108,536
[45] Date of Patent: Apr. 28, 1992

[54] LEAD CUT AND TAPE ATTACH APPARATUS

[75] Inventors: Paul J. Sokolovsky, Sunnyvale; Charles Anderson; Thomas Tarter, both of Santa Clara, all of Calif.

[73] Assignee: Advanced Micro Devices, Inc., Sunnyvale, Calif.

[21] Appl. No.: 501,444

[22] Filed: Mar. 30, 1990

[51] Int. Cl.$^5$ .................... B26D 1/00; B32B 31/00
[52] U.S. Cl. .................... 156/353; 156/355; 156/518; 156/520; 156/521
[58] Field of Search ............ 156/353, 355, 518, 520, 156/521

[56] References Cited

U.S. PATENT DOCUMENTS

4,581,096  4/1986  Sato .............................. 156/518 X
4,683,023  7/1987  Sokolovsky .................... 156/518

Primary Examiner—David A. Simmons
Assistant Examiner—James J. Engel, Jr.
Attorney, Agent, or Firm—Davis Chin

[57] ABSTRACT

A lead cut and tape attach apparatus (10) for automatically cutting leads on one side of a semiconductor I.C. quad device and subsequently cutting and attaching a piece of tape over the gaps formed between the cut leads and for sequentially cutting the leads and attaching tape thereover on the remaining sides of the quad device includes a double-acting punch assembly (34) formed of an inner punch blade (58) and an outer punch (56). There is provided upper and lower cams (68, 78) for actuating the inner punch blade relative to the outer punch so that on a first downward stroke the inner punch blade is extended to cut the leads of the quad device. On a second downward stroke of the punch assembly, the inner punch blade is retracted and the outer punch cuts and attaches the tape.

20 Claims, 8 Drawing Sheets

LEAD CUT AND TAPE ATTACH APPARATUS

BACKGROUND OF THE INVENTION

This invention relates generally to manufacturing processes for use with semiconductor integrated circuit quad devices and more particularly, it relates to a lead cut and tape attach apparatus for automatically cutting leads of a semiconductor integrated circuit quad device secured to a lead frame on its four sides and subsequently attaching a piece of adhesive tape over the gaps at each of the four sides in a sequential operation.

As is generally known in the art of manufacturing semiconductor devices such as I.C. or "chips," the semiconductor chip or die is secured to a rectangularly-shaped lead frame having a plurality of metal rails or leads extending inwardly from its four sides. The connection of the inner ends of the leads to the semiconductor die is accomplished by a known tape automated bonding procedure. This process serves to establish electrical connection with certain bond areas of the die containing electrical circuits. These I.C. packages (die and lead frame) are then usually delivered to various locations for subsequent processing before they are finally assembled into end products, such as PGA (pin grid array) packages. Such processing would typically include testing of the I.C. packages by attaching selected leads to appropriate testing equipment and measuring the operation of the electrical circuits. However, since all of the leads are joined together on the four sides by the lead frame, which serves to hold and protect the semiconductor die from damage during handling, this has rendered the I.C. packages somewhat unsatisfactory when it comes to testing them.

As a result, there has arisen a need for cutting or severing the leads on the four sides of the semiconductor I.C. package so as to permit testing of the same. However, this will require the use of costly carriers for holding the individual I.C. devices for the testing process and for protecting the leads from deformation since they have been separated from the lead frame.

It would therefore be desirable to provide an apparatus for automatically cutting leads of a semiconductor I.C. quad device secured to a lead frame on its four sides and subsequently applying a piece of adhesive tape over the gaps so as to maintain rigidity between the quad device and the lead frame. It would also be expedient to provide such apparatus which would cut the leads and thereafter apply a tape over the gaps at each of the four sides of the quad device in a sequential operation. As a result, the leads of the quad device being severed from the lead frame and then taped over serves to facilitate the subsequent testing process. This procedure has now eliminated the need of costly carriers for the testing process since the quad device is still joined mechanically to the lead frame. Thus, the lead frame can still be utilized to protect the leads from being deformed or damaged during other subsequent manufacturing processes.

For purposes of completeness, there is disclosed in U.S. Pat. No. 4,683,023 issued on July 28, 1987, to Paul J. Sokolovsky and assigned to the same assignee of the present invention a tape attach machine which includes a punch assembly for cutting and applying adhesive material onto the ends of a semiconductor device package. This '023 patent is hereby incorporated by reference. However, applicants are unaware of any known apparatus that is available for carrying out the cutting of the leads of a quad device and subsequently taping over them on each of the four sides in a sequential operation on an efficient and effective manner. The present invention provides a lead cut and tape attach apparatus which includes a unique indexing means for sequentially applying a piece of overlaying tape to the leads of a semiconductor quad device subsequent to the severing of the leads. The indexing means causes the quad device to be rotated incrementally after each side thereof has had the lead cutting and taping over operation performed.

SUMMARY OF THE INVENTION

Accordingly, it is a general object of the present invention to provide a lead cut and tape attach apparatus for automatically cutting leads of a semiconductor I.C. quad device secured to a lead frame on its four sides and subsequently attaching a piece of adhesive tape over the gaps at each of the four sides in a sequential operation.

It is an object of the present invention to provide a lead cut and tape attach apparatus for automatically cutting leads of a semiconductor I.C. quad device secured to a lead frame and subsequently cutting and attaching a piece of tape over the gaps formed between the cut leads, thereby facilitating testing of the quad devices with the lead frame being mechanically joined.

It is another object of the present invention to provide a lead cut and tape attach device which eliminates the need for costly carriers in subsequent testing processes, but yet still provides lead protection from deformation.

It is still another object of the present invention to provide a lead cut and tape attach apparatus which includes a punch assembly formed of an inner punch for cutting the leads and an outer punch for cutting the tape and attaching the same.

It is yet still another object of the present invention to provide a lead cut and tape attach apparatus which includes upper and lower cams for actuating an inner punch relative to an outer punch so that on a first downward stroke of the punch assembly the inner punch blade is extended to cut the leads of a semiconductor I.C. quad device and so that on a second downward stroke the inner punch blade is retracted and the outer punch cuts and attaches the tape.

In accordance with these aims and objectives, the present invention is concerned with the provision of a lead cut and tape attach apparatus for automatically cutting leads on one side of a semiconductor I.C. quad device and subsequently cutting and attaching a piece of tape over the gaps formed between the cut leads and for sequentially cutting the leads and attaching the tape thereover on the remaining sides of the quad device. The apparatus includes a device for holding the semiconductor I.C. quad device having a plurality of leads extending from its four sides and for sequentially rotating the same 90 degrees. A double-acting punch assembly is provided for cutting the leads on the one side of the quad device on a first downward stroke and for subsequently cutting and attaching a piece of tape over the gaps formed between the cut leads on a second downward stroke. A tape mechanism is provided for feeding a continuous roll of a tape between the holding device and the double-acting punch assembly.

The punch assembly includes an inner punch blade for cutting the leads and an outer punch for cutting the tape and attaching the same. The inner punch blade is disposed coaxially within the outer punch for slidable movement relative to one another. Upper and lower cams are provided for actuating the inner punch blade relative to the outer punch so that on the first downward stroke of the punch assembly the inner punch blade is extended to cut the leads of the quad device and so that on the second downward stroke of the punch assembly the inner punch blade is retracted and the outer punch cuts and attaches the tape. Thereafter, the holding device is caused to sequentially rotate 90 degrees so as to provide cutting and taping on the next side of the quad device. This is repeated until all four sides have the cutting and taping operation performed.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENT

Figure 1:
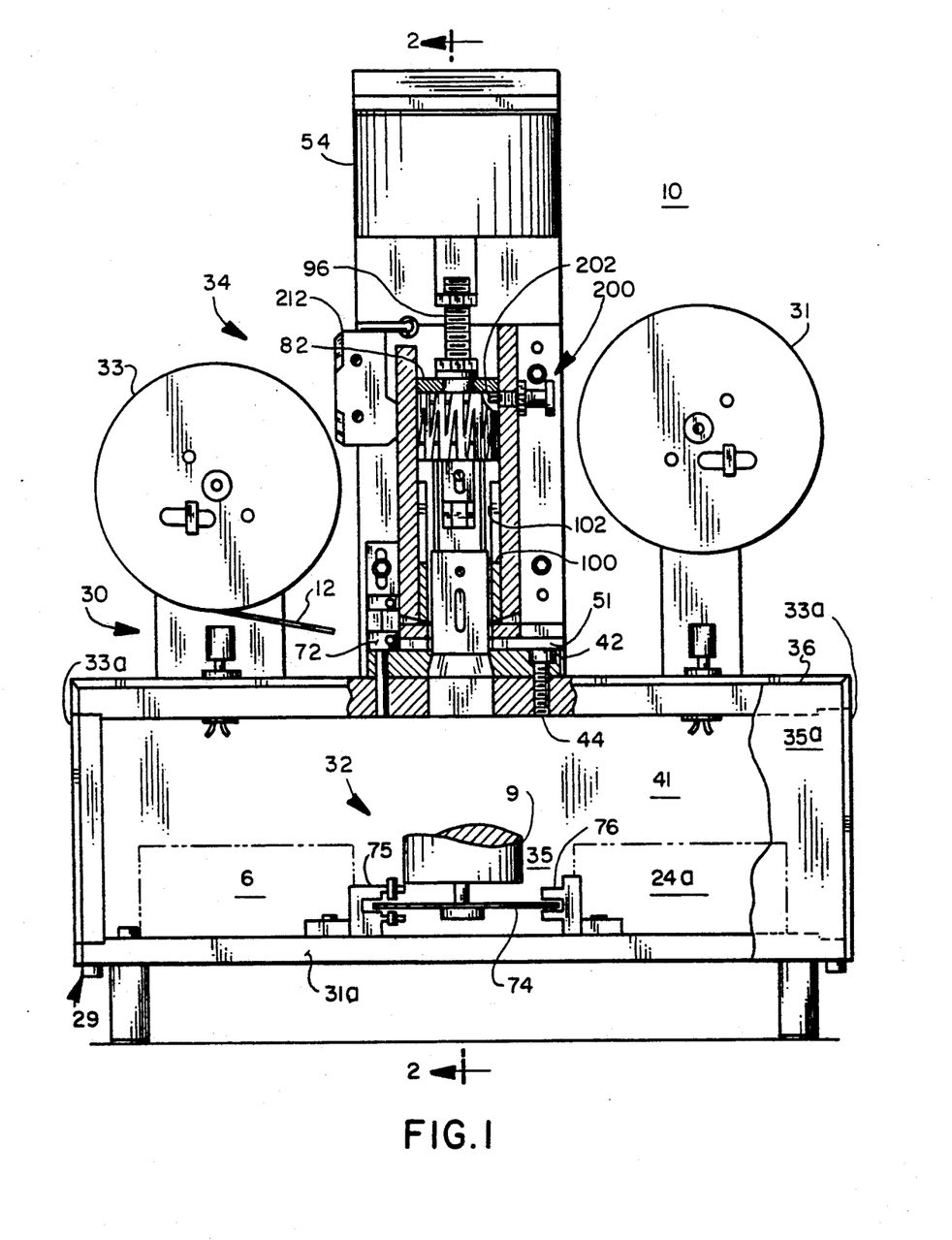
FIG. 1 is a front, cross-sectional view of a lead cut and tape attach apparatus, constructed in accordance with the principles of the present invention.
Figure 2:
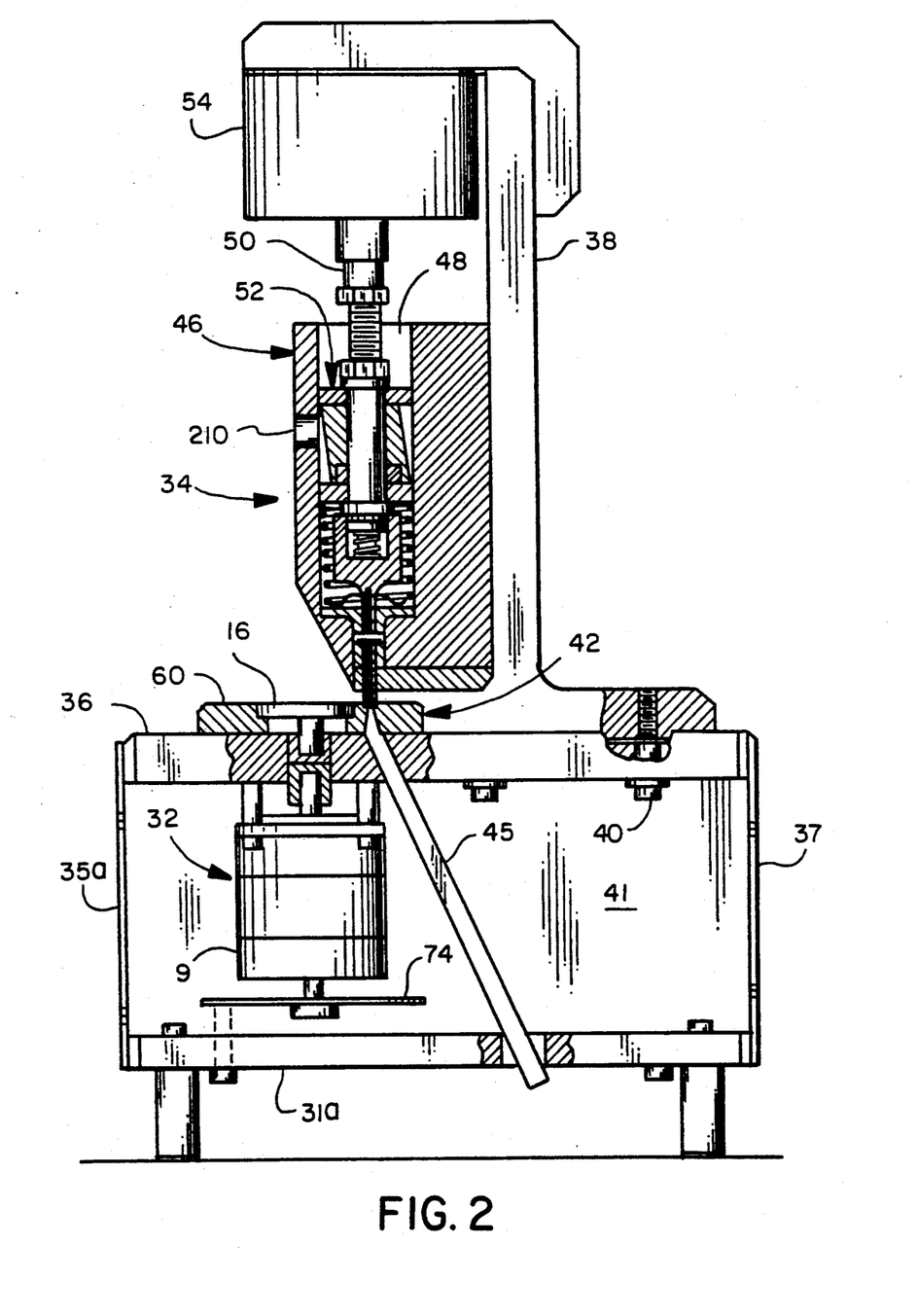
FIG. 2 is a side elevational view taken along the lines 2—2 of FIG. 1.
Figure 22:
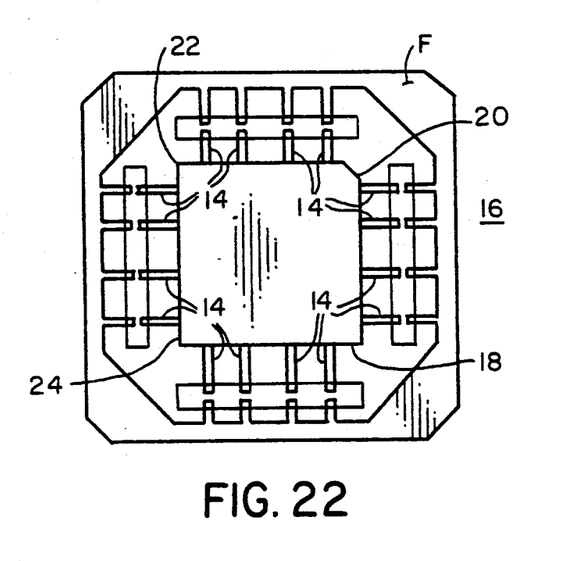
FIG. 22 is a top plan view of a semiconductor I.C. quad device in its finished condition with its leads on all four sides cut and taped over.

Referring now in detail to FIGS. 1 and 2 of the drawings, there is shown a lead cut and tape attach apparatus or machine 10 constructed in accordance with the principles of the present invention. The machine 10 as shown in FIGS. 1 and 2 is utilized to cut or sever each group of leads 14 protruding from a semiconductor (I.C.) quad device 16 (FIG. 22) and thereafter secure a piece of adhesive tape 12 over the gaps formed between the leads. As is shown in FIG. 22, the quad device 16 has a generally rectangularly-shaped configuration with sides 18, 20, 22 and 24 and a plurality of leads 14 extending from each of the four sides to a lead frame F. Each group of leads 14 on the successive sides of the quad device 16 is sequentially severed and then taped over at each of the sides 18-24 in one complete operating cycle.

The machine 10 includes a frame structure 29, a tape supply and winding apparatus 30, an I.C. unit loading station and die indexing assembly 32, a punch assembly 34, and an electromechanical control and synchronizing apparatus 35. The frame structure 29 includes a bottom plate 31a, a pair of side plates 33a, a front plate 35a and a rear plate 37, and a top bolster plate 36, all connected together to form an enclosure 41. The top bolster plate 36 extends horizontally between the front and rear plates 35a, 37 for mounting thereon the tape supply and winding apparatus 30, the I.C. unit loading station and die indexing assembly 32, and a vertical L-shaped mounting bracket 38. The enclosure 41 houses many components of the apparatus 35 and a shoot-channel 45 for discarding of residue or waste material from the severing and tape application operations, as will be explained later. The punch assembly 34 is fixedly secured to the vertical mounting bracket 38 via screws.

Figure 23:
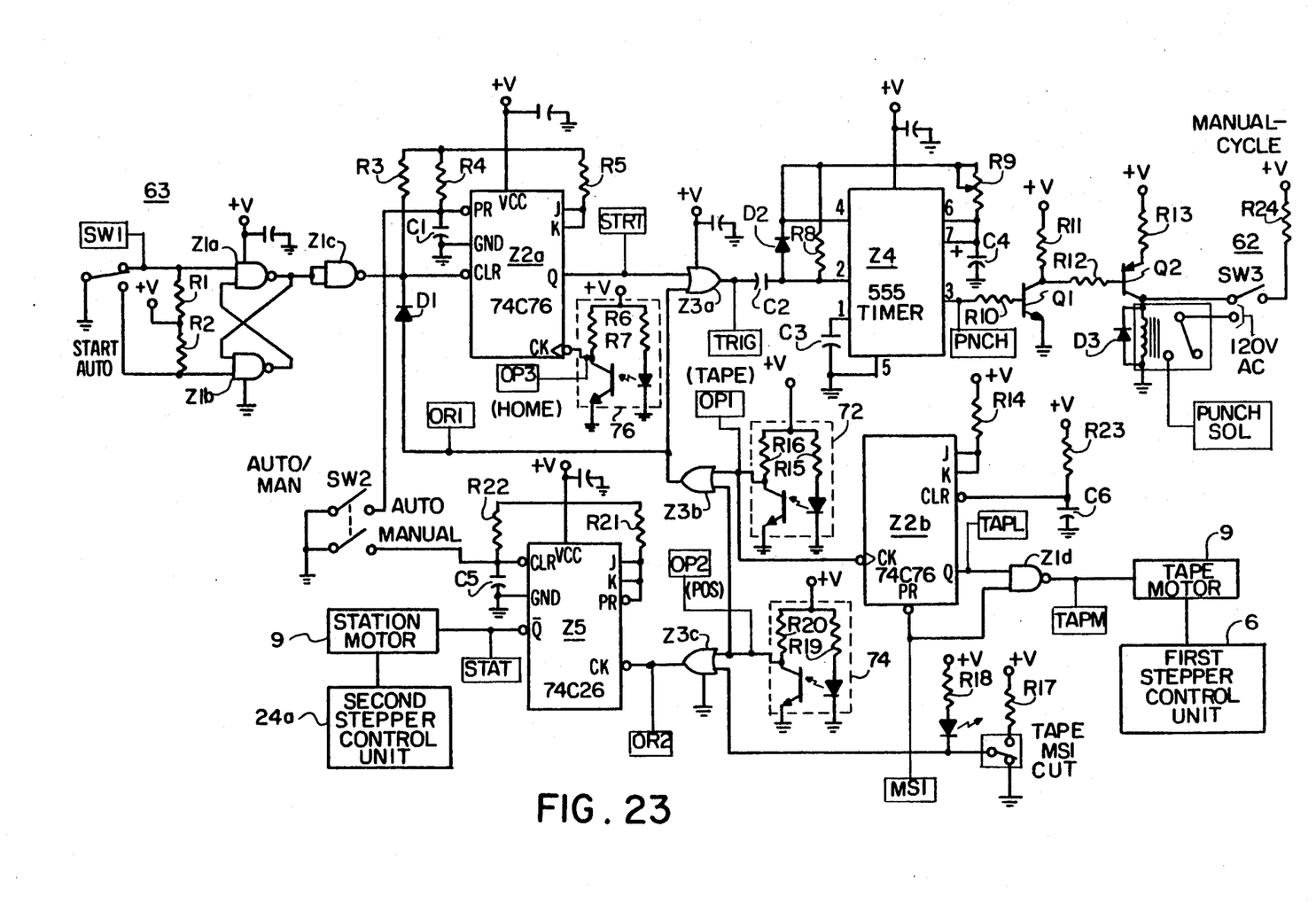
FIG. 23 is a detailed schematic circuit diagram for controlling the timing of the operations of those components used in carrying out the invention.

As to be hereinafter described in more detail, the electromechanical control and synchronizing mechanism 35 includes electronic circuitry (FIG. 23) for controlling the timing of the operations of those components of the apparatus used in carrying out the invention. A motor 9 for the apparatus is mounted in the enclosure 41 on the underneath side of the bolster plate 36 for tape feed and for rotation of the I.C. quad device. A first stepper motor control unit 6 is provided to cause the motor to control the tape feed operation. A second stepper motor control unit 24a is provided to cause the motor 9 to control the rotation of an I.C. unit holding device in the indexing assembly 32.

Figure 24:
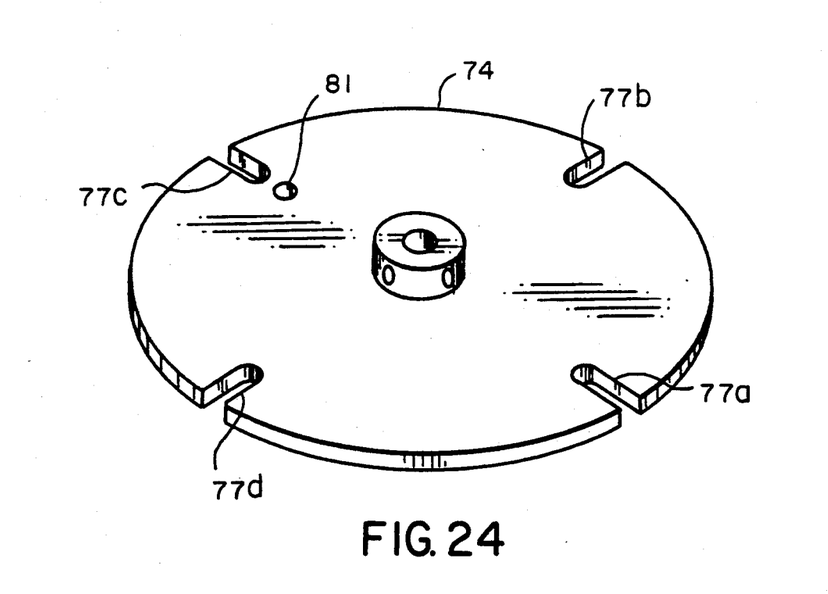
FIG. 24 is a top plan view of a slotted index disc 74 for use with the optical sensor assemblies 72 and 75 in FIG. 23.

The mechanism 35 further includes a first sensor assembly 72 (FIGS. 1 and 23) for determining the position of the tape 12 via a first optical assembly. The first optical assembly is formed of a light-emitting diode and a photo-transistor which operate in a conventional manner for detecting the presence of the opening in the tape and for generating a first sensed signal. A second sensor assembly 75 is provided for determining the position of the I.C. quad device disposed in the indexing assembly 32 via a second optical assembly. The second optical assembly is formed of a light-emitting diode and a photo-transistor and is used in conjunction with a slotted index disc 74, which operate in a conventional manner for detecting the presence of the U-shaped slots 77a–77d and for generating a second sensed signal. As can be seen from FIG. 24, the U-shaped slots 77a–77d are equally spaced 90° apart around the circumference of the index disc 74. A third sensor assembly 76 is provided for detecting the completion of a full operating cycle via a third optical assembly. The third optical assembly is formed also of a light-emitting diode and a photo-transistor and is further used in conjunction with the index disc 74, which operates in a conventional manner for detecting the presence of an opening 81 formed in the index disc 74 and for generating a third sensed signal.

A manual start switch 62 is provided to allow for manual cycling of the punch assembly 34 in order to initially cut out a tape segment as will be later explained. An auto start button 63 is provided to generate an automatic full cycle of operation for cutting and tape attachment on each side of the I.C. quad device. A microswitch MS1 is mounted on a microswitch holder 212 for operating the motor control units 6 and 24a for only predetermined periods of time so as to control the timing of the tape feeding and the rotation of the indexing assembly 32 operations.

The tape and supply winding apparatus 30 includes a tape supply reel 31 for carrying a roll of tape 12 and a take-up reel 33 which are synchronously driven by the stepper motor 9, as controlled by the stepper motor tape feed control unit 6, to provide passing intermittently a predetermined length of tape below the punch assembly 34. The tape 12 has an adhesive substance on its surface that faces the I.C. loading station and die indexing assembly 32. As best seen from FIG. 1, the tape exits the tape supply reel 31 and is fed through a slot 51 between the punch assembly 34 and the die plate 42 for cutting and overlaying a piece or segment of tape 12 on one side of the quad device 16 after its leads on that one side has been severed. Subsequent 90 degree rotation of the quad device by the indexing assembly 32 provide for the sequential lead cutting and then overlaying of tape on the leads at the remaining sides of the I.C. quad device 16. The sequential lead cutting and then overlaying of tape on the lead at each side prior to rotation is controlled by indexing assembly 32, as will be further described below.

Figure 5:
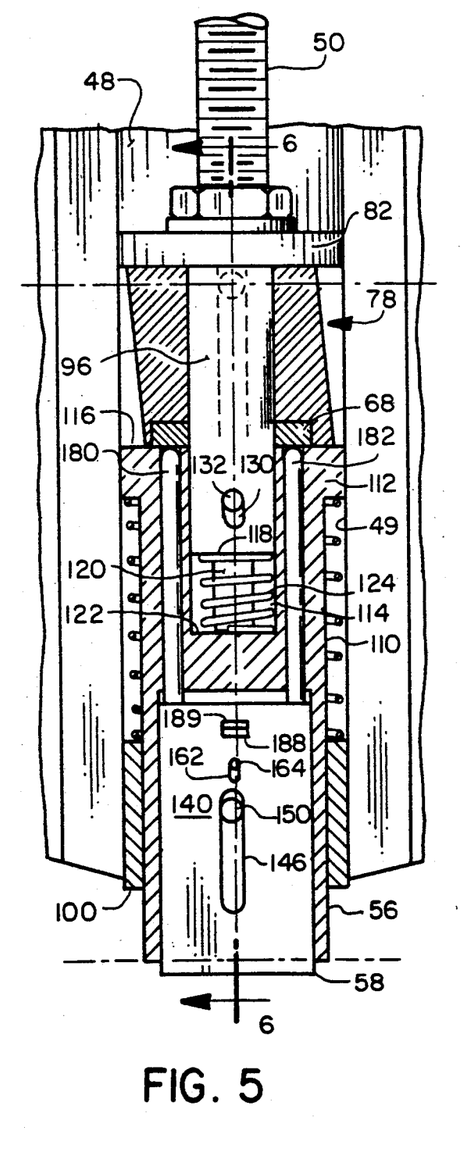
FIG. 5 is a view similar to FIG. 4, but illustrating the punch assembly in its second downward stroke of operation.
Figure 6:
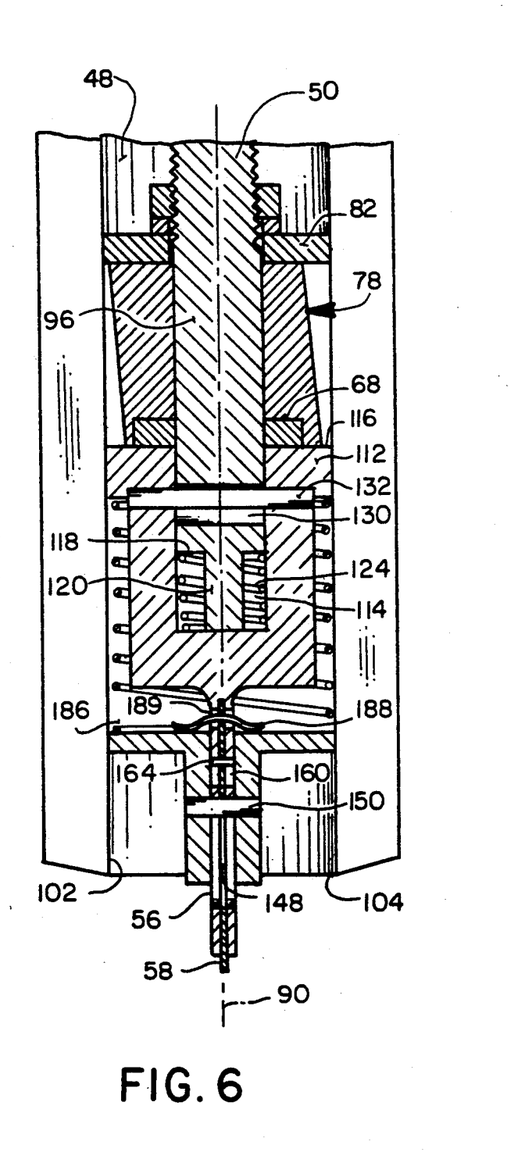
FIG. 6 is a side sectional view, taken along the lines 6—6 of FIG. 5.

The punch assembly 34 of FIGS. 1 and 2 operable for cutting the leads 14 on one side of the I.C. device 16 and subsequently attaching the piece of tape over the gaps formed by the severed leads and for sequentially cutting and taping of the leads on the other remaining sides of the I.C. will now be described in detail. Mounting bracket 38 (FIG. 2) for retaining punch assembly 34 is secured to and vertically extends from bolster plate 36 and is held in position by screws 40. Punch assembly holder 46 on bracket 38 has a vertical passage 48 with punch subassembly 52 coupled to shaft 50 and air cylinder 54, for example, for reciprocal operation in passage 48. Punch subassembly 52 is particularly illustrated in FIGS. 5 and 6 with first and outer punch 56 extended to contact the tape 12 between contact punch assembly 52 and die table 42 for securing a segment of tape 12 to all of the I.C. sides 18–22. Outer punch 56 in FIGS. 5 and 6 is withdrawn into passage 48 for engagement of second and inner punch 58 for a first downward punch stroke extending punch 58 beyond upper surface 60 of die plate 42 to sever the leads 14 at one side of I.C. 16. Retraction of the inner punch 58 into the outer punch 56 is simultaneously accompanied by indexing of cam 78 in passage 48 so as to move the outer punch 56 to cut a tape segment and overlay it on the severed leads 14.

Figure 3:
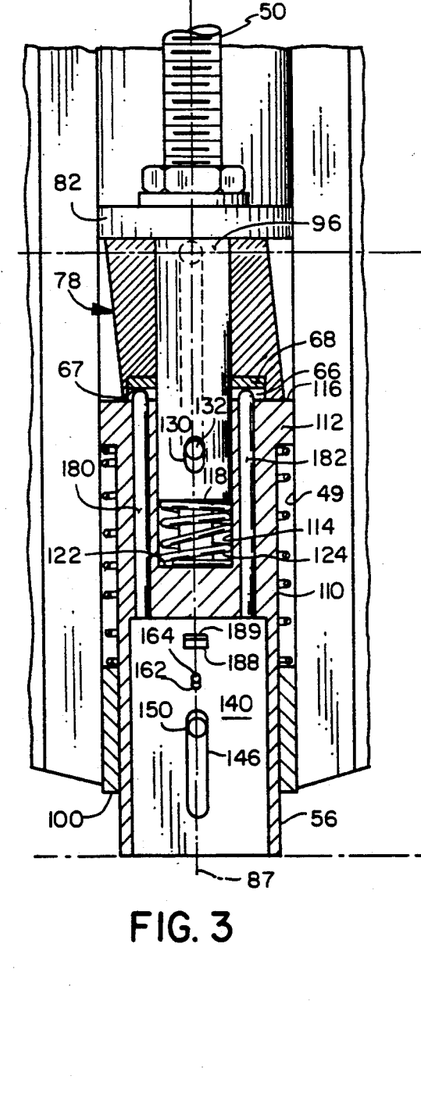
FIG. 3 is an enlarged, cross-sectional view of the punch assembly of the present invention, illustrating its first downward stroke of operation.
Figure 7:
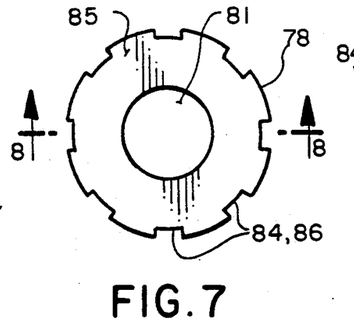
FIG. 7 is a top plan view of the upper cam.
Figure 8:
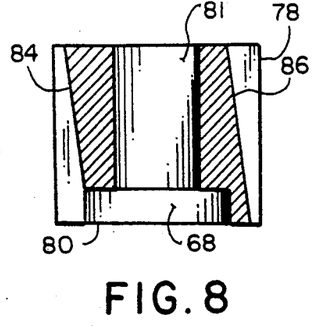
FIG. 8 is a cross-sectional view taken along the lines 8—8 of FIG. 7.

At the reference position of punch assembly 52, first dowel pin or push rod 182 and second dowel pin or push rod 184 (FIG. 3), which rods are parallel and juxtaposed on either side of punch assembly 52 in passage 48, are initially positioned in a cavity 66 of lower cam 68, which cam is shown with four cavities 66 equiangularly spaced at 90° increments about annular lower cam 68 and separated by planar arc segments 67, as shown in FIGS. 7 and 8.

Figure 9:
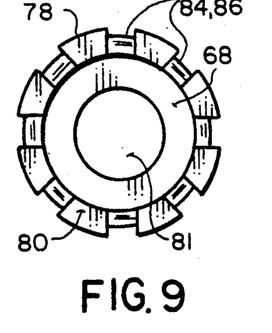
FIG. 9 is a bottom view of the upper cam.
Figure 13:
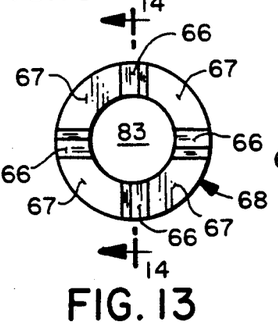
FIG. 13 is a bottom view of the lower cam.
Figure 14:
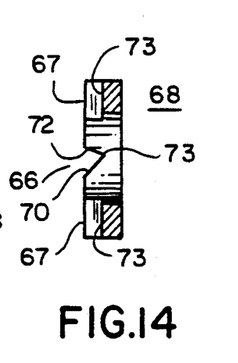
FIG. 14 is a view taken along the lines 14—14 of FIG. 13.
Figure 15:
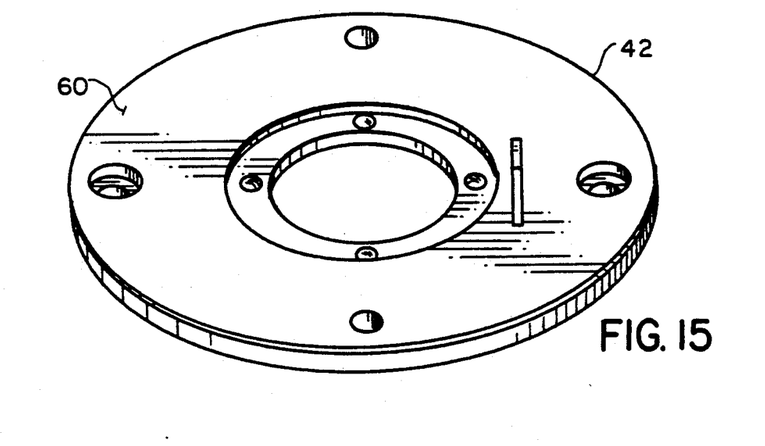
FIG. 15 is a perspective view of a die for cutting the leads.
Figure 16:
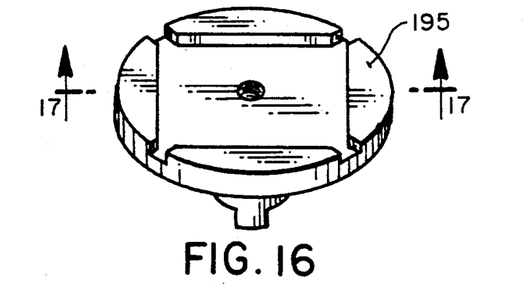
FIG. 16 is a perspective view of an I.C. unit holding device.
Figure 17:
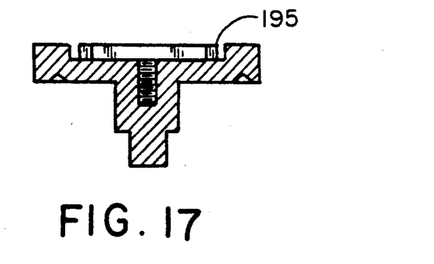
FIG. 17 is a view taken along the line 17—17 of FIG. 16.

Each cam cavity 66 in FIGS. 13 and 14 is provided with first upward sloping ramp 70 and second downward sloping ramp 72 intersecting at apex 73. Lower cam 68 in FIGS. 8 and 9 is integrally mounted in lower end 80 of second cam 78, which cams are mounted on shaft 50 through respective central bores 81, 83 below cam retainer 82 for reciprocal and rotating motion in passage 48.

Figure 10:
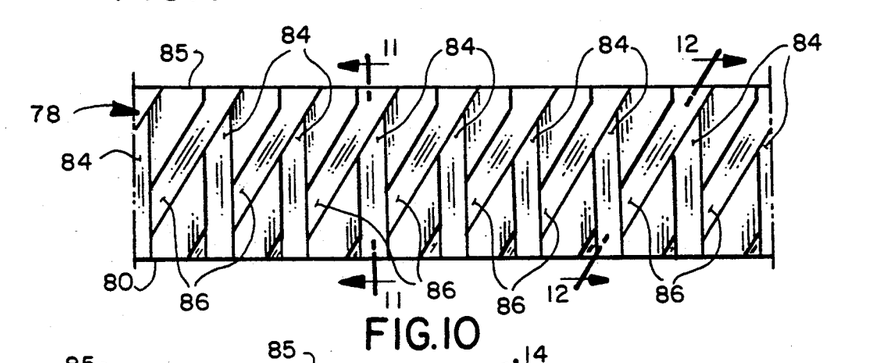
FIG. 10 is an unfolded view of the outer surfaces of the upper cam, illustrating the alternating vertical and angular passages.
Figure 11:
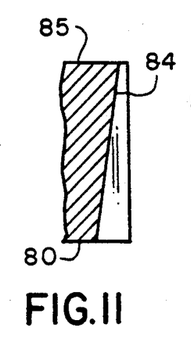
FIG. 11 is a view taken along the lines 11—11 of FIG. 10, illustrating one of the vertical passages.
Figure 12:
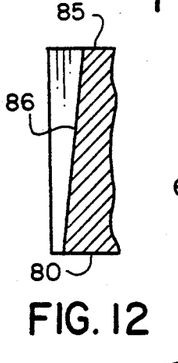
FIG. 12 is a view taken along the lines 12—12 of FIG. 10, illustrating one of the angular passages.

As shown in FIG. 10, second angular cam 78 has a family of vertical passages 84 and each adjacent pair of passages 84 are coupled by an angular passage 86, the passages 84 and 86 longitudinally extending about the perimeter to form a complete circumferential path about cam 78. Further, the angled slots or passages 86 are in closer proximity to the longitudinal axis 90 of the punch subassembly 52 at the upper segment of cam 78, and the vertically aligned slots 84 are in closer proximity to the longitudinal axis 90 at the lower end of the second cam 78.

Figure 18:
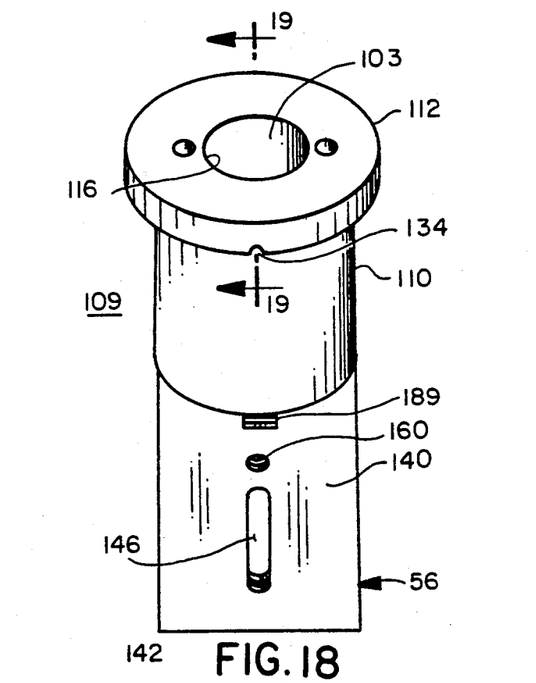
FIG. 18 is a perspective view of the inner punch blade.
Figure 19:
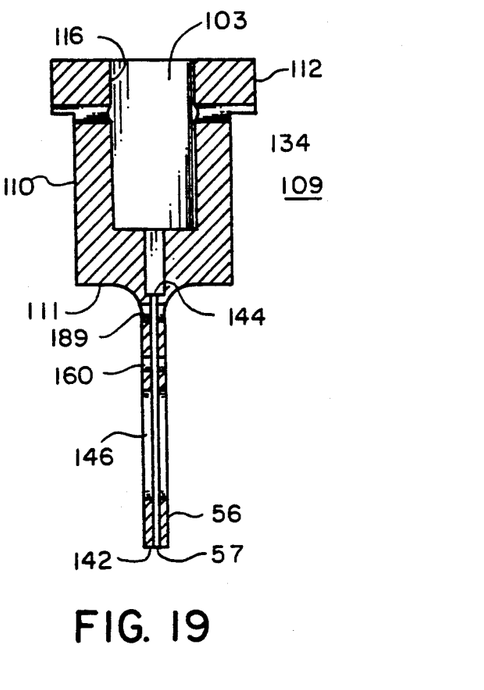
FIG. 19 is a view taken along the lines 19—19 of FIG. 18.
Figure 20:
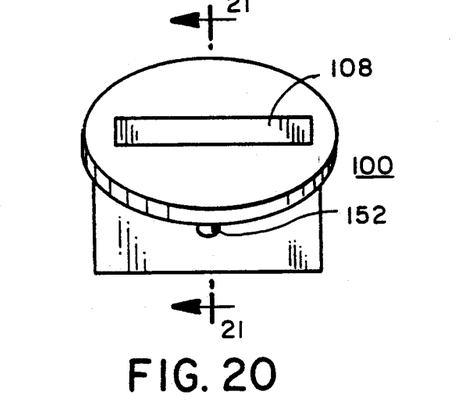
FIG. 20 is a perspective view of the outer punch.
Figure 21:
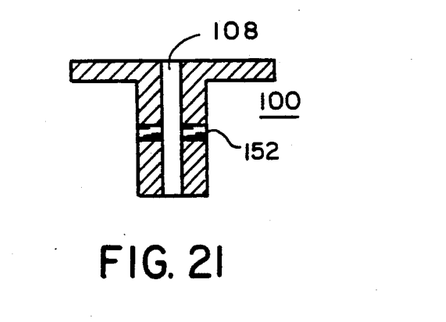
FIG. 21 is a view taken along the lines 21—21 of FIG. 20.

Punch shaft 96 for driving inner and outer punches 56, 58 extends from drive shaft 50 through the cam bores 81, 83 of the respective cams 78, 68 into blind-hole bore 103 of punch guide 109 (FIG. 18), which includes sidewall 110 and collar 112 contacting sidewall 49 and slidably operable in passage 48. Guide 109 has outer punch 56 longitudinally extending from its lower end 111 with longitudinal passage 57 for inner punch 58. Punch guide bushing 100 with aperture 108 of subassembly 52 is inserted in punch sleeve 102 at lower end 104 for slidable mounting of punch guide 109 for guiding outer punch 56 for engagement with I.C. 16 and lower die 42. Punch guide 109, with sidewalls 110 and upper collar 112 (CF FIGS. 3-5) contacts bushing 100 and sidewall 49 of passage 48, respectively, to retain and reciprocally guide punches 56, 58. Punch guide blind-hole bore 114 is open at its upper end 116 to receive lower end 118 of punch shaft 96, which has a stub shaft 120 contacting lower end 122 of blind-hole bore 103 in FIG. 3. Punch shaft 96 and stub shaft 120 are slidably displaceable from lower end 122 during the upward or withdrawal stroke of punches 56, 58 of FIG. 4. Die spring 124 in bore 114 is operable to bias and displace punch shaft 96 and lower end 122, as shown in FIG. 4.

Figure 4:
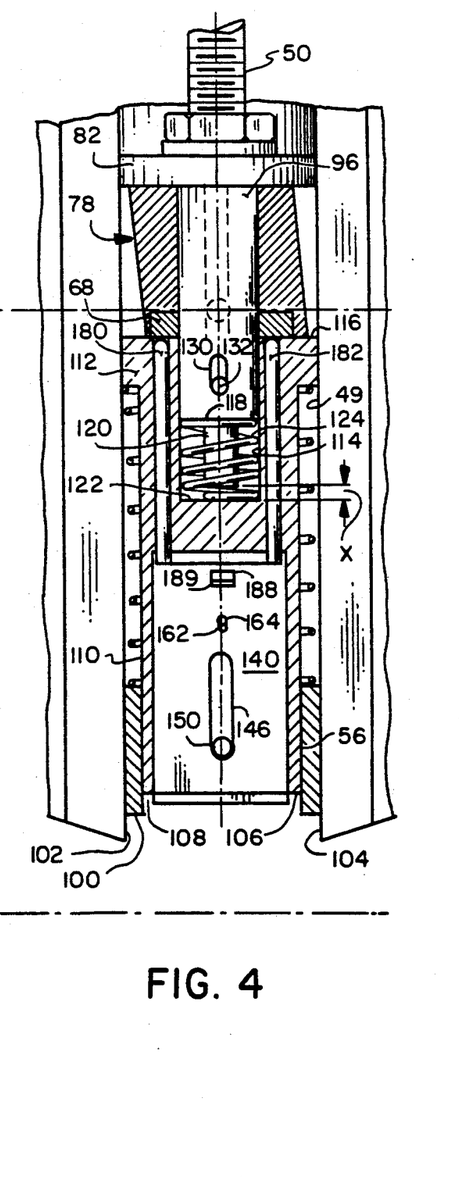
FIG. 4 is a view similar to FIG. 3, but illustrating the punch assembly in its first upward stroke of operation.

Shaft 96, which is the driving connection between the drive apparatus and the punch assemblies at the base of the punch holder, has transverse slot 130, illustrated as an elliptical slot in proximity to shaft lower end 118, with a dowel pin 132 extending through punch guide cross-bore 134 to couple punch guide 109 and shaft 96 for cooperative vertical movement as a mated assembly and for accommodating increment of displacement "X" in FIG. 4 between stub shaft 120 and blind-hole bore lower end 122.

Outer punch 56 has a generally broad face 140, a wall 142, an elongated slot 144 vertically extending therethrough for slidably mounting second punch 58. Cross slot 146 in FIG. 3 vertically extends through the broad face 140 and wall 142 and is shown as an elongated, elliptically shaped cross slot extending parallel to axis 90. A similar slot 148, which is aligned with cross slot 146 in FIG. 6, is provided by inner punch 58, which cross slots provide an operating path to receive a securing dowel pin 150 extending through aperture 152 of guide sleeve 100, which allows vertical reciprocal predetermined travel distance of punches 56 and 58 within guide sleeve 100. A second and shorter cross slot arrangement 160, 162 in punches 56, 58 respectively, is vertically upwardly displaced from cross slot 146 and similarly aligned therewith axis 90. A second dowel pin 164 securing punches 56 and 58, but allowing a vertical displacement of second punch 58 at the first automatic stroke of punch assembly 52 to sever leads 14 of I.C. 16. The vertical displacement of inner punch 58 is provided by the added incremental displacement "X" at engagement of the dowel pins or push rods 180, 182 with lower face 67 of first cam 68 and the correlative downward displacement of dowel pin 132 and punch shaft 96 to contact and drive second punch 58 against override spring 188 in chamber 186 beneath the punch assembly.

More specifically, dowel pins 180 and 182 are effectively grounded between lower cam drive surface 67 and the upper surface of inner punch 58 to mechanically drive the inner punch for the lead cutting function and overcomes spring 188, which has the strongest bias force of the springs that operate in the assembly. In the tape cutting and application step, dowel pins 180 and 182 are vertically displaced upward by their movement up the ramped cam surface 70 into proximity with apex 73, which provides the vertical displacement "X" and allows override or upward travel of inner punch 58 in outer punch 56 to provide for the operational displacement by the lower end of the inner punch assembly to contact the punch 56 and provide for punch displacement only to the surface 60 of bolster plate 40, thereby limiting their function to the tape cutting and application step. Spring 188, as noted, is the strongest spring in the mechanical system and requires the locked physical dowel pin contact in order to displace inner punch 58 against its bias force for vertically downward displacement and lead cutting. This inner spring 188 is visible through window 189 in the punch assembly 56, 58 in FIGS. 3-6.

As noted above, each of the several sides 18-24 of I.C. 16 are subject to lead severing and tape application operations until all of the several sides of each I.C. 16 have been provided with a lead-severing function. The I.C. 16 is rotatable within its holding platen 195 provided in bolster plate 36 to index each of the several sides in alignment for the lead-severing and tape application functions. Thereafter the dual-punch arrangement and each of the noted steps is indexed. Provision of this sequential indexing and mechanical apparatus functioning to provide dual step arrangement is provided by insertion of a spring-loaded extending dowel pin arrangement 200 as shown in FIG. 1 with an extending tip 202 contacting the upper cam 78 and more particularly operable in vertical and angular slots 84 and 86.

In the indexing operation, vertical downward travel of the punch assembly 52 moves cam 78 past pin tip 202 (FIG. 1) in vertical slot 84 until pin tip 202 contacts upper portion or is in proximity to cam upper surface 85 for rotation of cam 78 to align angular slot 86 with dowel pin point 202. Thereafter, vertical upward travel of punch assembly 52 rotates the cam 78 about axis 90 as dowel pin point 202 travels in angular slot 86 until it is aligned with the sequential or subsequent vertical slot 84 at lower end 80 of cam 78. Rotation of upper cam 78 moves cam 68 to provide sequential contact of each of the flats 67 and ramps 66 with the driving dowel pins 180, 182.

In the illustrated embodiment, this vertical and rotational motion is provided eight times, wherein the upper cam 78 will rotate lower cam 68 about 45° at each vertical stroke of the punch assembly 52. The initial manual stroke or vertical downward stroke provides movement of outer punch 56 for cutting the tape and produces an operating window. Subsequent punch alignment is usually checked through port 210 in upper member 46 as noted in FIG. 2. Subsequent vertical stroke of the punch assembly 52 rotates cams 68 and 78 45° and aligns dowel pins 180 and 182 with lower surface 67 of lower cam 68 to provide a mechanically grounded or fixed contact between inner punch 58 and dowel pins 180, 182 for displacement of the punch 58 against the bias force of spring 188, which is overcome, for vertical displacement of the punch 58 by the incremental distance "X" for severing of the leads 14, and in the incremental distance "X" below the surface 60 of die plate 42. Thereafter, the punch assembly is vertically upwardly displaced by its mechanical coupling with the drive shaft 96.

Having described the details of the present lead cut and tape attach apparatus, the operation of the punch assembly 52 of this invention constructed as illustrated above for cutting the leads and applying a tape will now be explained with specific reference to FIGS. 3-6, 23 and 24. The specific sequence of operational stage for each cycle of lead-severing and tape application functions includes initializing the punch such that dowel pins 180 and 182 are provided in a lower cam 68 cavity at cavity apex 73, which position is insured by sighting through a sight hole 210 in the sidewall of punch holder 46. Tape 12 on reels 31, 33, is provided between the punches 56, 58 and the I.C. 16, which has been mounted in the die plate 42 with one of its sides 18-24 in vertical alignment with the punches. Thereafter, the punch assembly is indexed manually by pressing the manual start switch SW3 (62), and a tape segment is cut or separated from the tape 12 and then removed from the die plate so as to be ready for the automatic mode.

At the return stroke of the punch assembly during the manual indexing, the upper cam 78 will rotate the lower cam 68 about 45° which will displace dowel pins 180, 182 from cam apex 73 and put them in contact with the lower cam surface 67, which will provide the support for the lead cutting blade 58. Simultaneously, the upward travel of the punch assembly will actuate the microswitch MS1 so as to place the same in the "cut" position, as illustrated in the schematic diagram of FIG. 23. The machine 10 is now ready for the automatic mode.

In order to start the automatic full cycle of operation for cutting the leads and attaching the tape over the gaps on each side of the I.C. device 16, the auto start switch SW1 (63) is depressed so as to generate a signal PNCH which causes a first vertical downward stroke of the punch assembly. This vertical downward stroke of the punch assembly will displace inner punch 58 to cut the leads 14 by its vertical displacement past the upper surface 60 of die plate 42 for severing the leads 14.

At the first return stroke of the punch assembly, the microswitch MS1 will be actuated so as to move the same to the "tape" position. As a result, a signal TAPM will be generated so as to cause the tape feed motor 9, controlled by the first stepper control unit 6, to advance the tape 12 in the tape supply and winding apparatus 30 so as to provide an uncut tape portion under the punch assembly. The motor 9 continues to advance the tape until the opening in the tape is sensed by the first optical assembly 72. This causes the tape feed motor 9 to stop and at the same time, a signal OP1 will be generated which corresponds to the first sensed signal indicative of the completion of the first downward stroke.

This upward stroke of the punch assembly causes simultaneously the upper and lower cam assemblies 78, 68 to rotate by the mechanical interaction of the grooves 84, 86 with dowel pin 200 as noted above. In this position the lower cams 78, 68 are indexed to move the dowel pins from contact with lower surface 67 of lower cam 68 into the ramped cam surfaces for moving the dowel pin ends toward apex 73. In this position the dowel pins 180, 182 are displaced from intimate contact with the punch assembly 56, 58 and, therefore, inner spring 188, which is the strongest spring in the system, is operable to displace or maintain the punch assemblies in contact with the stub shaft and lower punch arrangement such that outer punch 56 is downwardly driven to cut, displace and mount a piece of tape over the gaps formed by the severed leads. After the feed cycle has been completed, the punch assembly is automatically actuated by the signal PNCH for a second vertical downward stroke and the tape is cut and attached over the previous lead-cut gaps.

On the second return stroke of the punch assembly 52, the microswitch MS1 in the holder 212 will again be actuated so as to move the same back to the "cut" position. As a result, a signal STAT will be generated so as to cause the station motor 9, as controlled by the second stepper control unit 24a, to rotate or index the I.C. unit loading station and die indexing assembly 32 for subsequent lead-severing operation on the next side of the I.C. device 16. The station motor continues to rotate the assembly 32 until the next U-shape slot 77b on the disc 74 is sensed by the second optical assembly 75. It will be noted that the slot 77b is spaced 90° apart from the slot 77a. Thus, the station motor will be stopped only after a 90° rotation has taken place. At this time, a signal OP2 will be generated corresponding to the second sensed signal indicative of the completion of the second downward stroke.

Simultaneously, the upward travel of the punch assembly will cause upper cam 78 to be rotated by the vertical and angular travel of the dowel pin 200 which moves or rotates the upper cams 78 and 68 through a 45° increment at each vertical reciprocation of the punch assembly. Thus, positioning the lower cam surface 67 in contact with the dowel pins 180, 182 for cutting the leads 14 of this next side of the I.C. 16 through the previously cut window in the tape 12.

Similarly, each of the several remaining sides of the I.C. are indexed through a quarter cycle like that just described on the one side to provide severing and taping of leads at each of the several sides of the I.C. After the slotted index disc 74 has been rotated 360° by the motor, the opening 81 will be sensed by the third optical assembly 76. This causes a signal OP3 to be generated which inhibits the further operation of the punch assembly. Thereafter, the completed I.C. unit is displaced either manually or mechanically and a new I.C. 16 is positioned in bolster plate 36 and the cycle or sequence of operations is again commenced by merely pressing the auto start switch SW1 without providing the initializing stage as the window from the previous operation is now or should be aligned with the surface or side 18-24 of the subsequent I.C. 16.

From the foregoing detailed description, it can thus be seen that the present invention provides a lead cut and tape attach apparatus for automatically cutting leads of a semiconductor I.C. quad device secured to a lead frame on its four sides and subsequently attaching a piece of adhesive tape over the gaps at each of the four sides in a sequential operation. The apparatus of the present invention facilitates electrical testing of the I.C. quad devices since they are still joined mechanically to the lead frame. Further, there has been eliminated the need of costly carriers used during the testing processes but yet still the leads of the quad devices are protected from deformation during other subsequent manufacturing processes.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. A lead cut and tape attach apparatus for automatically cutting leads on one side of a semiconductor I.C. quad device and subsequently cutting and attaching a piece of tape over the gaps formed between the cut leads and for sequentially cutting the leads and attaching the tape thereover on the remaining sides of the quad device, said apparatus comprising:

means (32) for holding a semiconductor I.C. quad device having a plurality of leads extending from its four sides and for sequentially rotating the same 90 degrees;

double-acting punch assembly means (34) for cutting the leads on one side of the quad device on a first downward stroke and for subsequently cutting and attaching a piece of tape over gaps formed between the cut leads on a second downward stroke;

means (30) for feeding a continuous roll of tape between said holding means and said double-acting punching assembly means;

said punch assembly means (30) including an inner punch blade (58) for cutting the leads and outer punch (56) for cutting the tape and attaching the same, said inner punch blade being disposed coaxially within said outer punch for slidable movement relative to one another;

cam means (68, 78) for actuating said inner punch blade relative to said outer punch so that on the first downward stroke of said punch assembly means said inner punch blade is extended to cut the leads of the quad device and so that on the second downward stroke of said punch assembly means said inner punch blade is retracted and said outer punch cuts and attaches the tape;

means (54) for reciprocating and returning said punch assembly means so that said inner punch and said outer punch move together as a mated assembly along a longitudinal axis;

first sensor means (72) for generating a first signal to indicate when said first downward stroke has been completed;

said feeding means being responsive to said first signal to cause said tape to be advanced a predetermined length;

second sensor means (74) for generating a second signal to indicate when said second downward stroke has been completed; and said holding means being responsive to said second signal to cause the sequential 90 degree rotation of said quad device.

2. A lead cut and tape attach apparatus as claimed in claim 1, wherein said cam means includes an upper cam (78) and a lower cam (68) which is driven by said upper cam, said lower cam having four cavities (66) spaced equally apart at 90 degrees and separated by planar arcuate segments.

3. A lead cut and tape attach apparatus as claimed in claim 2, further comprising pusher pin means including dowel pins (180, 182) for moving alternately in and out of said cavities in said lower cam so as to cause said inner punch blade to be extended when said dowel pins are out of engagement with said cavities and so as to cause said inner punch blade to be retracted when said dowel pins are in engagement with said cavities.

4. A lead cut and tape attach apparatus as claimed in claim 3, further comprising driven means (84, 86) formed on the outer surface of said upper cam for rotating said lower cam so as to cause said dowel pins to move alternately in and out of said cavities.

5. A lead cut and tape attach apparatus as claimed in claim 4, wherein said driven means comprises a family of sequentially intersecting vertical passages (84) and angular passages (86) extending longitudinally about its perimeter to form a complete circumferential path about the outer surface of said upper cam.

6. A lead cut and tape attach apparatus as claimed in claim 5, wherein there are eight vertical passages (84) being spaced equally apart at 22.5 degrees and separated therebetween by said angular passages (86).

7. A lead cut and tape attach apparatus as claimed in claim 6, wherein said angular passages (86) are more closely positioned to the longitudinal axis adjacent the top end of the upper cam, and wherein said vertical passages (84) are more closely positioned to the longitudinal axis adjacent the lower end of the upper cam.

8. A lead cut and tape attach apparatus as claimed in claim 7, further comprising cam pilot means including a spring-loaded plunger (200) for moving in said vertical and angular passages so as to cause rotation of said upper cam by 45 degrees upon the vertical upward travel of said plunger along the angular passages to cause indexing of said lower cam.

9. A lead cut and tape attach apparatus as claimed in claim 8, further comprising spring bias means (188) for urging upwardly said inner punch blade when said dowel pins are in engagement with said cavities.

10. A lead cut and tape attach apparatus for automatically cutting leads on one side of a semiconductor I.C. quad device and subsequently cutting and attaching a piece of tape over the gaps formed between the cut leads and for sequentially cutting the leads and attaching the tape thereover on the remaining sides of the quad device, said apparatus comprising:

means (32) for holding a semiconductor I.C. quad device having a plurality of leads extending from its four sides and for sequentially rotating the same 90 degrees;

double-acting punch assembly means (34) for cutting the leads on one side of the quad device on a first downward stroke and for subsequently cutting and attaching a piece of tape over gaps formed between the cut leads on a second downward stroke;

means (30) for feeding a continuous roll of tape between said holding means and said double-acting punching assembly means;

said punch assembly means (30) including an inner punch blade (58) for cutting the leads and outer punch (56) for cutting the tape and attaching the same, said inner punch blade being disposed coaxially within said outer punch for slidable movement relative to one another;

cam means (68, 78) for actuating said inner punch blade relative to said outer punch so that on the first downward stroke of said punch assembly means said inner punch blade is extended to cut the leads of the quad device and so that on the second downward stroke of said punch assembly means said inner punch blade is retracted and said outer punch cuts and attaches the tape; and said holding means (32) sequentially rotating said quad device 90 degrees after the second downward stroke.

11. A lead cut and tape attach apparatus as claimed in claim 10, wherein said cam means includes an upper cam (78) and a lower cam (68) which is driven by said upper cam, said lower cam having four cavities (66) spaced equally apart at 90 degrees and separated by planar arcuate segments.

12. A lead cut and tape attach apparatus as claimed in claim further comprising pusher pin means including dowel pins (180, 182) for moving alternately in and out of said cavities in said lower cam so as to cause said inner punch blade to be extended when said dowel pins are out of engagement with said cavities and so as to cause said inner punch blade to be retracted when said dowel pins are in engagement with said cavities.

13. A lead cut and tape attach apparatus as claimed in claim 12, further comprising driven means (84, 86) formed on the outer surface of said upper cam for rotating said lower cam so as to cause said dowel pins to move alternately in and out of said cavities.

14. A lead cut and tape attach apparatus as claimed in claim 13, wherein said driven means comprises a family of sequentially intersecting vertical passages (84) and angular passages (86) extending longitudinally about its perimeter to form a complete circumferential path about the outer surface of said upper cam.

15. A lead cut and tape attach apparatus as claimed in claim 14, wherein there are eight vertical passages (84) being spaced equally apart at 22.5 degrees and separated therebetween by said angular passages (86).

16. A lead cut and tape attach apparatus as claimed in claim 15, wherein said angular passages (86) are more closely positioned to the longitudinal axis adjacent the top end of the upper cam, and wherein said vertical passages (84) are more closely positioned to the longitudinal axis adjacent the lower end of the upper cam.

17. A lead cut and tape attach apparatus as claimed in claim 16, further comprising cam pilot means including a spring-loaded plunger (200) for moving in said vertical and angular passages so as to cause rotation of said upper cam by 45 degrees upon the vertical upward travel of said plunger along the angular passages to cause indexing of said lower cam.

18. A lead cut and tape attach apparatus as claimed in claim 17, further comprising spring bias means (188) for urging upwardly said inner punch blade when said dowel pins are in engagement with said cavities.

19. A lead cut and tape attach apparatus comprising:
an inner punch blade (58) for cutting leads on one side of a semiconductor I.C. quad device;
an outer punch (56) for cutting and attaching a piece of tape over gaps formed between the cut leads;
said inner punch blade being disposed coaxially within said outer punch for slidable movement relative to one another;
cam means (68, 78) for actuating said inner punch blade relative to said outer punch so that on a first downward stroke said inner punch blade is extended to cut the leads of the quad device and so that on a second downward stroke said inner punch blade is retracted and said outer punch cuts and attaches the tape; and
indexing means (32) for sequentially rotating said I.C. quad device 90 degrees after the second downward stroke.

20. A lead cut and tape attach apparatus as claimed in claim 19, wherein said cam means includes an upper cam (78) and a lower cam (68) which is driven by said upper cam, said lower cam having four cavities (66) spaced equally apart at 90 degrees and separated by planar arcuate segments.

* * * * *